(12) United States Patent
Zhou

(10) Patent No.: US 9,066,427 B2
(45) Date of Patent: Jun. 23, 2015

(54) CONDUCTIVE LAYER OF TOUCH SCREEN

(71) Applicant: NANCHANG O-FILM TECH. CO., LTD., Nanchang (CN)

(72) Inventor: Fei Zhou, Nanchang (CN)

(73) Assignee: Nanchang O-Film Tech. Co., Ltd., Nanchang, Jiangxi (CN)

( * ) Notice: Subject to any disclaimer, the term of this patent is extended or adjusted under 35 U.S.C. 154(b) by 81 days.

(21) Appl. No.: 14/000,135

(22) PCT Filed: Jul. 6, 2013

(86) PCT No.: PCT/CN2013/078941
§ 371 (c)(1),
(2) Date: Aug. 16, 2013

(87) PCT Pub. No.: WO2014/146381
PCT Pub. Date: Sep. 25, 2014

(65) Prior Publication Data
US 2014/0284079 A1  Sep. 25, 2014

(51) Int. Cl.
*H05K 1/00* (2006.01)
*H05K 1/02* (2006.01)
(52) U.S. Cl.
CPC ................................ *H05K 1/0296* (2013.01)
(58) Field of Classification Search
USPC .......................................... 174/250; 345/173
See application file for complete search history.

(56) References Cited

U.S. PATENT DOCUMENTS

| 2009/0002337 A1 | 1/2009 | Chang | |
| 2010/0123670 A1* | 5/2010 | Philipp | 345/173 |
| 2010/0182272 A1 | 7/2010 | Kang et al. | |
| 2012/0062250 A1 | 3/2012 | Kuo | |
| 2013/0161179 A1* | 6/2013 | Tamura et al. | 200/600 |
| 2014/0198264 A1 | 7/2014 | Gao et al. | |

FOREIGN PATENT DOCUMENTS

| CN | 101819482 A | 9/2010 |
| CN | 102216891 A | 10/2011 |
| CN | 102722279 A | 10/2012 |
| JP | 2009009574 A | 1/2009 |
| TW | 201023014 A | 6/2010 |
| TW | 201211867 A | 3/2012 |

* cited by examiner

*Primary Examiner* — Andargie M Aychillhum
(74) *Attorney, Agent, or Firm* — Coats and Bennett, PLLC

(57) ABSTRACT

A conductive layer of a touch screen is disclosed including a mesh made of metal wire. The conductive layer includes a sensing area and a wiring area electrically connected to the sensing area, the sensing area includes at least one of the first sensing patterns and at least one of the second sensing patterns, the first sensing pattern and the second sensing pattern are adjacent and electrically insulated from each other, mesh cells in each first sensing pattern are mutually connected, mesh cells in each second sensing pattern are mutually connected. The wiring area includes a plurality of wiring clusters which are mutually insulated, each wiring cluster is formed by interconnecting a column of mesh cells, and one end of each wiring cluster is electrically connected to one of the second sensing patterns. The conductive layer having a structure of metal mesh can be manufactured by imprinting process. Comparing to the conventional technology with ITO film as conductive layer, the imprinting has advantages of one step formation of the mesh, simplified process and high yield rate. In addition, the material cost is greatly reduced using metal instead of ITO, since no etching process is used, the conductive material will not be wasted.

14 Claims, 9 Drawing Sheets

CONDUCTIVE LAYER OF TOUCH SCREEN

FIELD OF THE INVENTION

The present disclosure relates to touch screens, and more particularly relates to a conductive layer of a touch screen.

BACKGROUND OF THE INVENTION

Touch screen is an induction device which can receive touch input signals. The touch screen brings a brand new look to information exchanges and becomes a very appealing new information exchange device. The development of the touch screen technology has drawn a widespread attention from global information media field, and has become an emerged sunrise high-tech industry in optoelectronics industries.

A conductive layer is an essential part of the touch screen. Currently, the conductive layer of the touch screen is Indium Tin Oxide (ITO) formed on an insulative substrate mainly through processes of vacuum plating and graphical etching. The graphical etching not only has high requirements in process and equipment, but also wastes a lot of ITO material during etching, and produces large amounts of industrial waste containing heavy metals.

SUMMARY

It is an object of the present invention to provide a new conductive layer of a touch screen in order to overcome the problem of large material waste during the manufacture of the conductive layer by ITO.

A conductive layer of the touch screen includes a mesh composed of metal wire, the mesh includes a plurality of mesh cells, and the mesh cell includes a plurality of sides and a plurality of intersection points formed by two adjacent sides. The conductive layer includes a sensing area and a wiring area electrically connected to the sensing area, the sensing area includes a plurality of first sensing patterns and a plurality of second sensing patterns, the first sensing pattern and the second sensing pattern are adjacent and electrically insulated from each other, mesh cells in each first sensing pattern are mutually connected, mesh cells in each second sensing pattern are mutually connected. The wiring area includes a plurality of wiring clusters, the wiring clusters are mutually insulated, each wiring cluster is formed by interconnecting a column of mesh cells, and one end of each wiring cluster is electrically connected to one of the second sensing patterns.

In one embodiment, each wiring cluster has two common intersection points with the second sensing pattern.

In one embodiment, part of the wiring clusters include a trunk portion, two adjacent mesh cells in the trunk portion are merely connected by a common intersection point.

In one embodiment, part of the wiring clusters further include a branch portion connected to the trunk portion, two adjacent mesh cells in the branch portion are connected by a common side and have two common intersection points, a mesh cell at one end of the branch portion is connected to a mesh cell at one end of the trunk portion by a common side.

In one embodiment, the conductive layer further includes a color matching line forming complementary graphics with the sensing area and the wiring area, and the color matching line is electrically insulated from the sensing area and the wiring area.

In one embodiment, the color matching line between the trunk portions of two adjacent wiring clusters loses a mesh side intersected with a first line, and the first line is the straight line extending in a direction parallel to the extension direction of the trunk portion.

In one embodiment, the color matching line between the trunk portions of two adjacent wiring clusters is disconnected in a middle portion of the mesh side, and the length of the disconnection ranges from 2 to 20 micrometers.

In one embodiment, the length of the disconnection ranges from 3 to 9 micrometers.

In one embodiment, the length of the disconnection is 6 micrometers.

In one embodiment, the trunk portion is disconnected at an intersection point of the mesh cell adjacent to a color matching line.

In one embodiment, two adjacent mesh cells in part of the wiring clusters are connected by a common side and have two common intersection points.

In one embodiment, the mesh cells of the metal mesh have a shape of rhombus.

In one embodiment, the sensing area includes a left sensing area and a right sensing area, the left sensing area and the right sensing area are separately arranged, each left sensing area and each right sensing area both include a plurality of first sensing patterns and a plurality of second sensing patterns, the wiring area is located between the left sensing area and the right sensing area.

In one embodiment, the conductive layer is axisymmetric.

The above mentioned conductive layer having a structure of metal mesh can be manufactured by imprinting. Comparing to the conventional technology with ITO as conductive layer, the imprinting has advantages of one step formation of the mesh, simplified process and high yield. In addition, the material cost is greatly reduced using metal instead of ITO, since no etching process is used, the conductive material will not be wasted, and it reduces heavy metal emission in the waste liquid.

DETAILED DESCRIPTION OF THE EMBODIMENTS

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
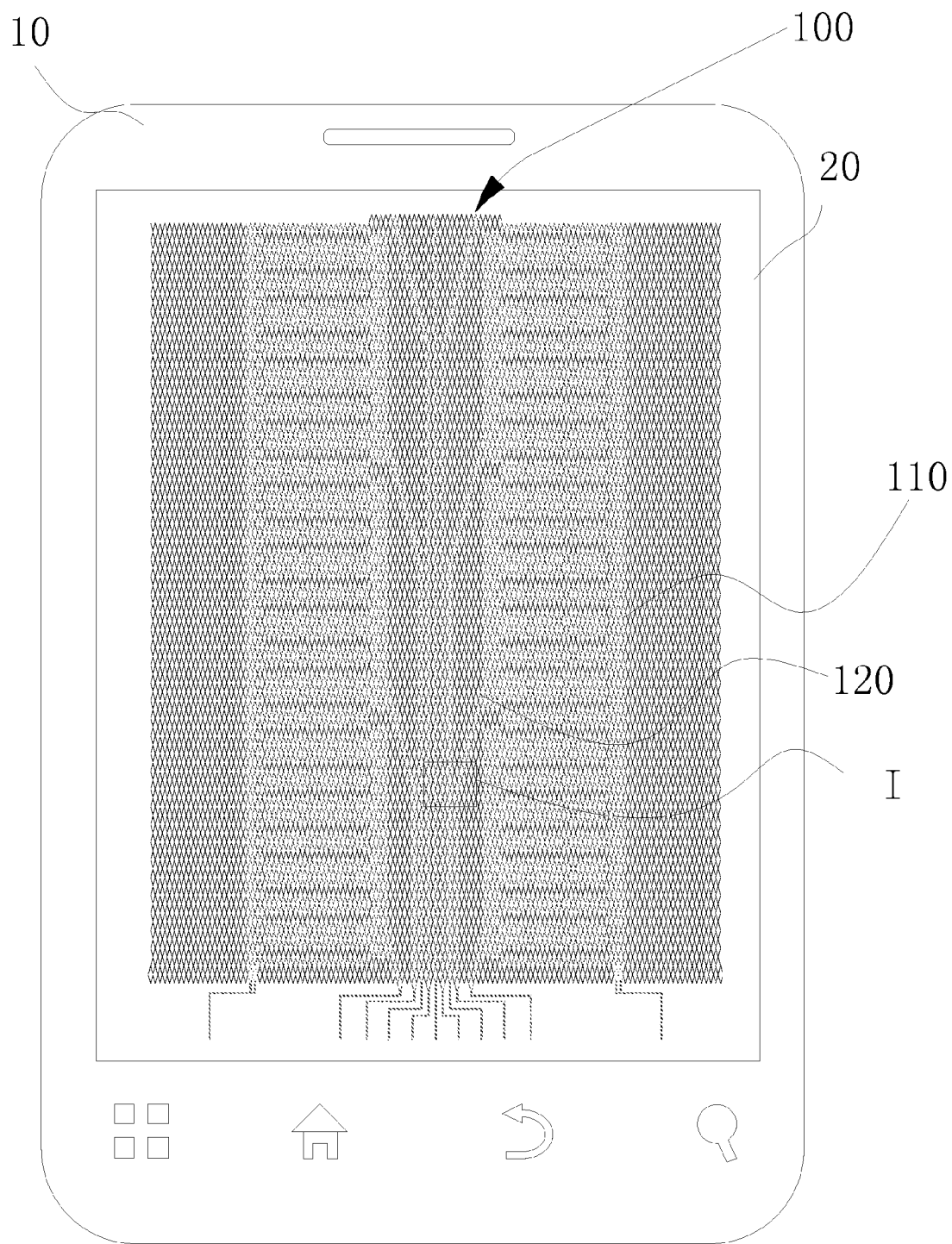
FIG. 1 is a schematic, front view of an embodiment of a touch screen.

Referring to FIG. 1, an embodiment of a touch screen includes a glass substrate 10, a substrate layer 20, and a conductive layer 100. The substrate layer 20 is formed on the glass substrate 10, and the conductive layer 100 is formed on the substrate layer 20. The conductive layer 100 includes a mesh composed of metal wire, the mesh includes a plurality of mesh cells, and each of the mesh cells includes a plurality of sides and a plurality of intersection points formed where two adjacent sides connect. In the illustrated embodiment, each mesh cell of the metal mesh has a shape of rhombus. In alternative embodiments, each mesh cell of the metal mesh can have alternative shape, such as rectangle, triangle, and so on. The conductive layer 100 includes a sensing area 110 and a wiring area 120 electrically connected to the sensing area 110.

In the illustrated embodiment, in order to reduce color difference and obtain a better display effect, the conductive layer 100 further includes a color matching line forming complementary graphics with the sensing area 110 and the wiring area 120. The color matching line, which can be omitted in alternative embodiments, is electrically insulated from both the sensing area 110 and the wiring area 120. In the illustrated embodiment, the mesh cells of the sensing area 110, wiring area 120 and color matching lines have the same shape and cycle, while in alternative embodiment, the shape and cycle can be different, for instance, the color matching line can be serrated line or fold line.

Figure 2A:
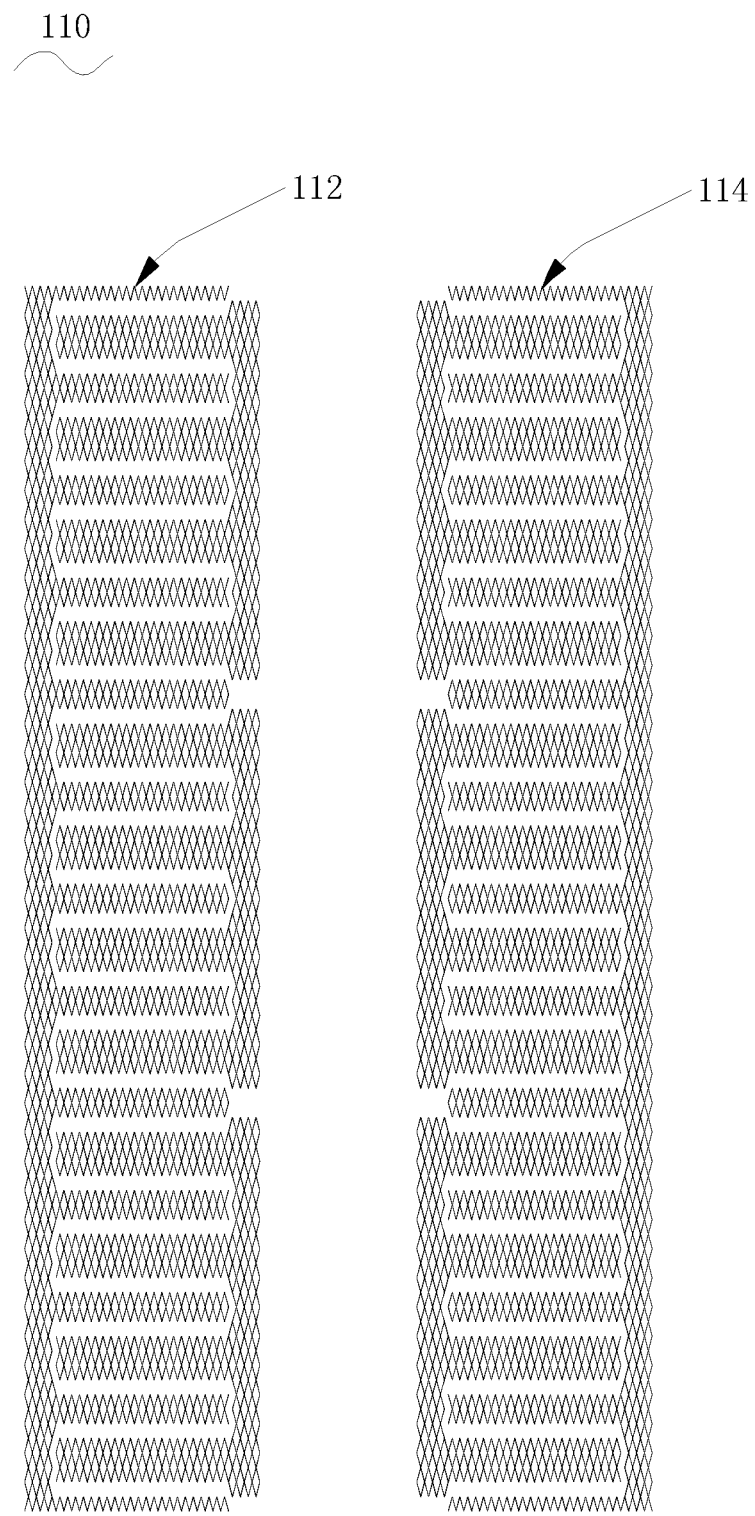
FIG. 2A is a schematic view of a sensing area.
Figure 2B:
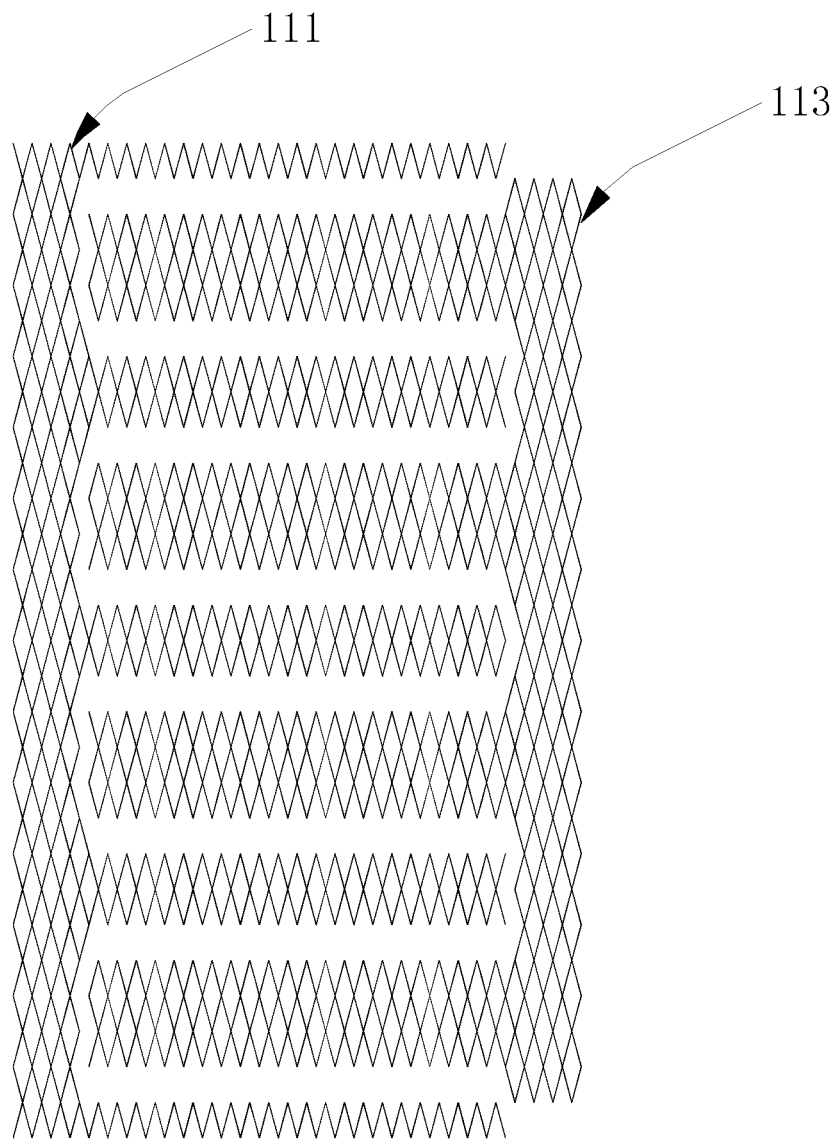
FIG. 2B is a partial, enlarged view of FIG. 2A.

Referring to FIG. 1, the conductive layer 100 is axisymmetric, i.e. the conductive layer 100 is axisymmetric about a perpendicular bisector thereof. In alternative embodiments, the conductive layer 100 may have other structures rather than axisymmetry. Referring also to FIG. 2B, the sensing area 110 includes at least one first sensing patterns 111 and at least one second sensing patterns 113, the first sensing pattern 111 and the second sensing pattern 113 are adjacent and electrically insulated from each other, the mesh cells in each first sensing pattern 111 are mutually connected, the mesh cells in each second sensing pattern 113 are mutually connected. Referring to FIG. 2A, In the illustrated embodiment, the sensing area 110 includes a left sensing area 112 and a right sensing area 114, which are separately arranged. The left sensing area 112 and the right sensing area 114 are symmetric about a symmetry axis due to the axisymmetric structure of the conductive layer 110 of illustrated embodiment, each left sensing area 112 and each right sensing area 114 include at least one of the first sensing patterns 111 and at least one of the second sensing patterns 113.

Figure 3A:
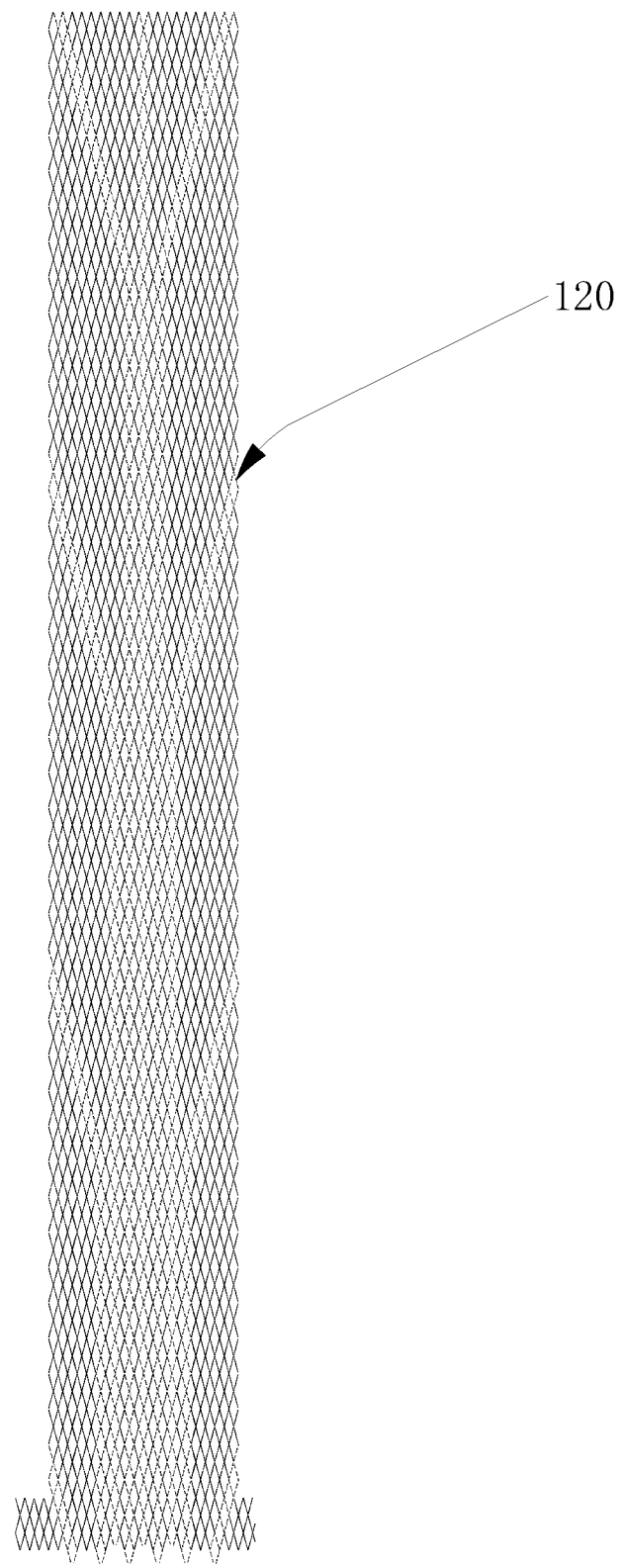
FIG. 3A is a schematic view of a wiring area and a color matching line located between the wiring area and the sensing area.
Figure 3B:
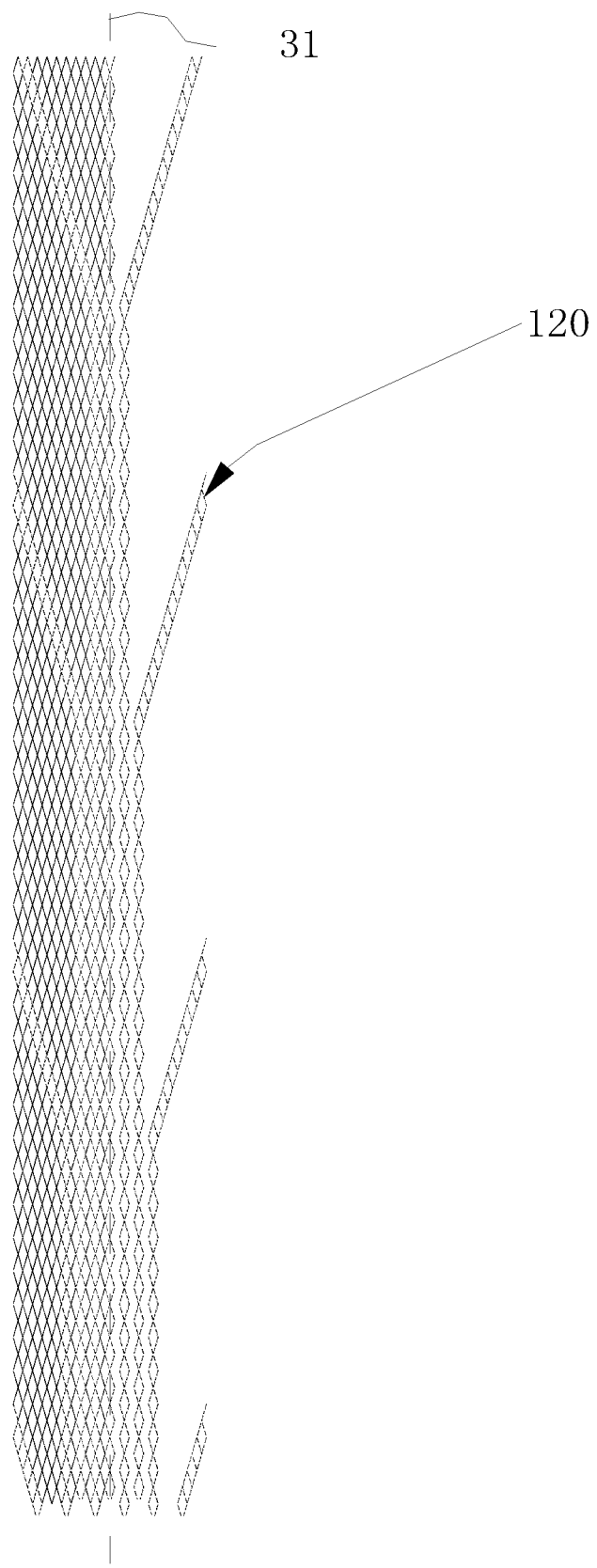
FIG. 3B is a schematic view of FIG. 3A after removing the color matching line on the right side of a symmetry axis.

The wiring area 120 is located between the left sensing area 112 and the right sensing area 114. FIG. 3A shows the structure of the wiring area and the color matching line located between the wiring area 120 and the sensing area 110. In order to distinguish the wiring area 120 and the adjacent color matching line, FIG. 3B shows the structure of the color matching line on the left hand of symmetry axis after removing the color matching line on the right hand of the symmetry axis.

Figure 7:
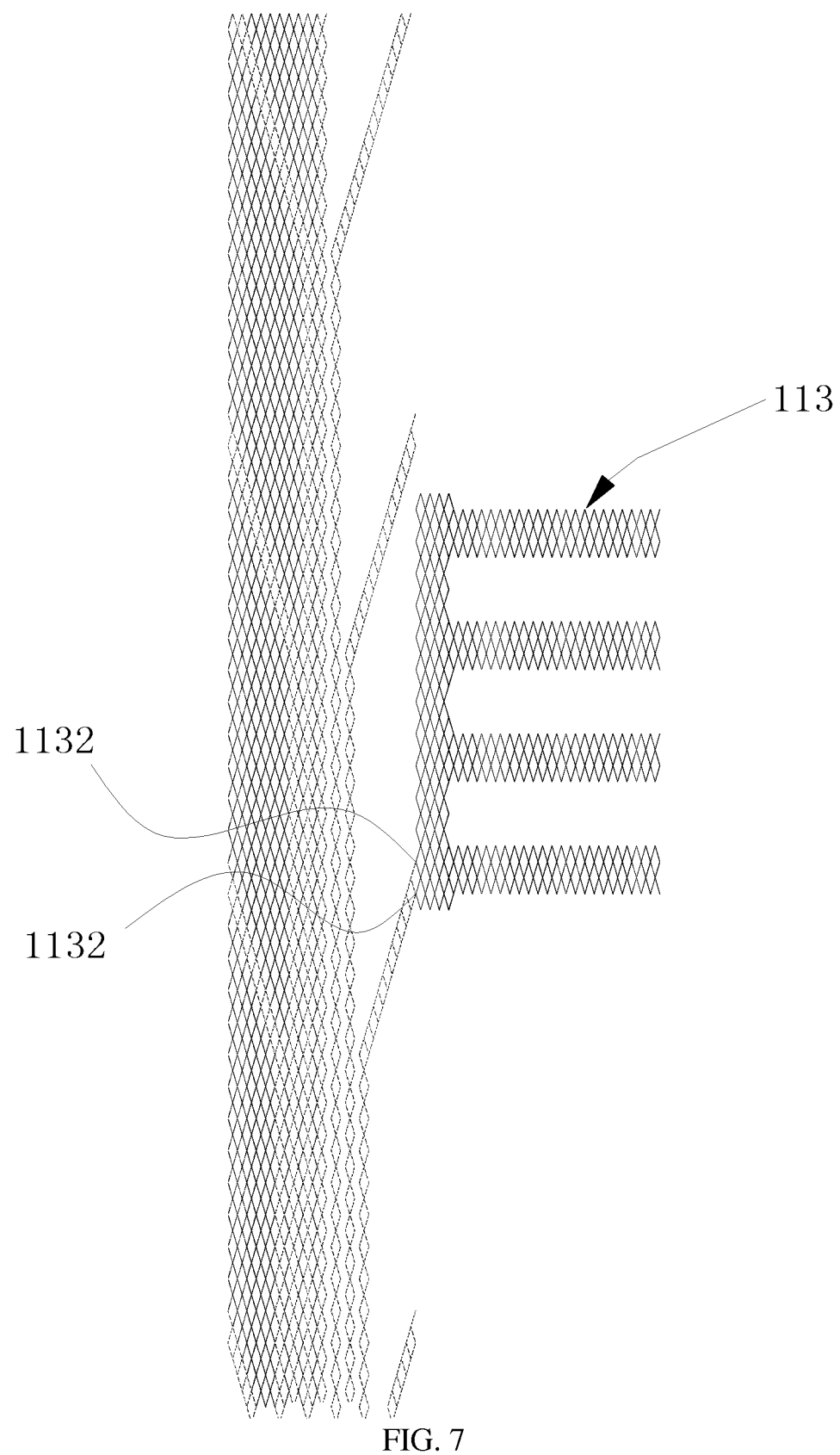
FIG. 7 is a schematic view of the wiring cluster of FIG. 3B which is connected to the second sensing pattern.

The wiring area 120 includes a plurality of wiring clusters, a number of the wiring clusters is equal to a number of the second sensing patterns 113, each wiring cluster is correspondingly connected to one second sensing patterns, and the wiring clusters are mutually insulated. In the illustrated embodiment, each wiring cluster is formed by interconnecting a column of mesh cells. An area the wiring clusters located is a touch sensing fade zone, such single column wiring structure can reduce the area of the touch sensing fade zone as much as possible, and improve the touch sensibility of the touch screen. Referring to FIG. 7, each wiring cluster has two common intersection points 1132 with the second sensing pattern 113.

Figure 4A:
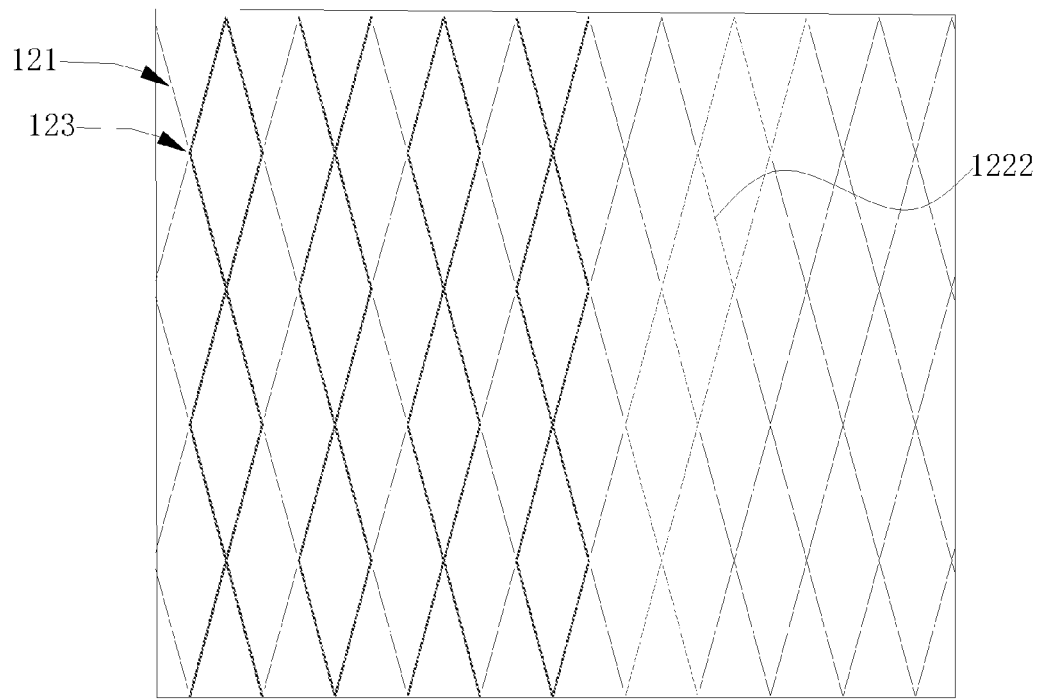
FIG. 4A is a partial, enlarged view of an area I of FIG. 1.
Figure 4B:
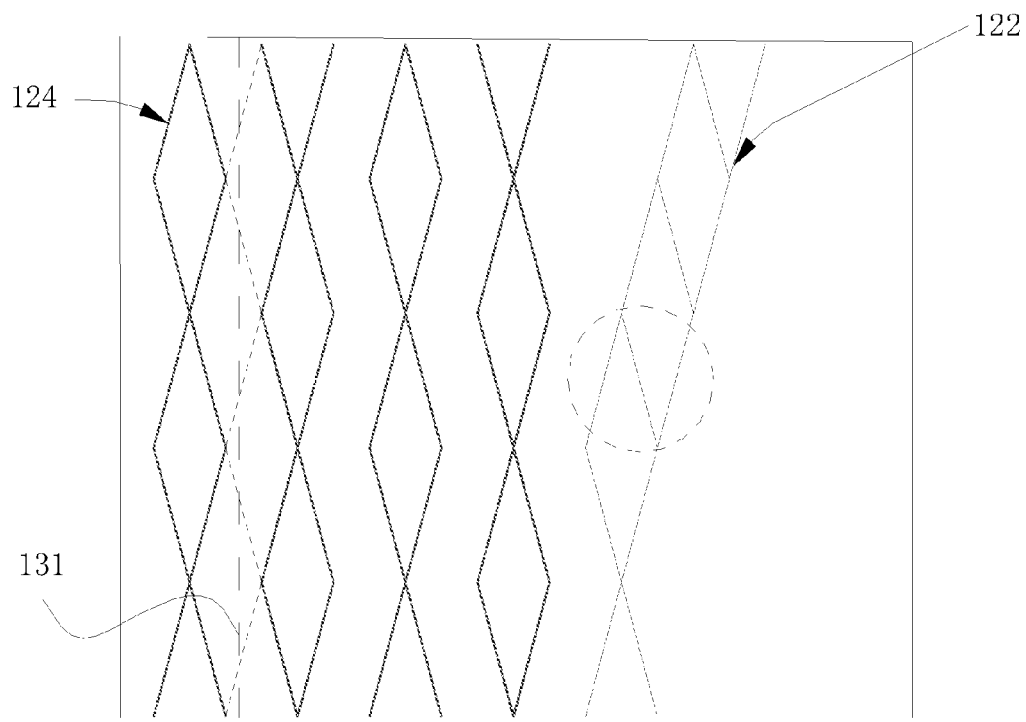
FIG. 4B is a schematic view of FIG. 4A after removing the color matching line.

FIG. 4A is a partial, enlarged view of an area I of FIG. 1. FIG. 4B is a schematic view of FIG. 4A after removing the color matching line. Referring to FIG. 4A and FIG. 4B, each wiring cluster includes a branch portion 122 and is connected to the second sensing pattern 113 by the branch portion 122. Two adjacent mesh cells in each branch portion 122 are connected by a common side 1222 and have two common intersection points. In the illustrated embodiment, the wiring cluster further includes a trunk portion 124 connected to the branch portion 122, the trunk portions 124 of each wiring cluster are mutually parallel, the branch portion 122 is induced to the edge of the conductive layer 100 by the trunk portion 124 and then connected to a PCB board by conductive wire, thus transmitting the capacity change caused signal to the PCB board. Two adjacent mesh cells in each trunk portion 124 are merely connected by a common intersection point. A mesh cell at one end of the trunk portion 124 is connected to a mesh cell at one end of the branch portion 122 by a common side which is shown in FIG. 4B and marked by a dotted circle box.

The trunk portion 124 is mainly used to induce the branch portion to a bottom edge of the conductive layer 110, thus the second sensing pattern 113 adjacent to the bottom edge of the conductive layer 110 can be directly induced to the edge of the conductive layer 100, i.e., the trunk portion 124 is not included in the corresponding wiring cluster, two adjacent mesh cells in the wiring cluster are connected by a common side and have two common intersection points.

Two diagonal lines of the rhombus shaped mesh cell extend along an X direction and a Y direction of a Cartesian coordinate system, respectively, i.e., the trunk portion 124 extends along the Y direction. Referring to accompanying drawings, the wiring area 120 is also asymmetric, the wiring area on the left hand of symmetric axis is connected to the left sensing area 112, and the wiring area on the right hand of the symmetric axis is connected to the right sensing area 114.

As previously described, the conductive layer 100 further includes a color matching line. According to the working principle of the touch screen, the second sensing patterns 113 and the wiring clusters both should be mutually insulated, therefore, the insulation effect is performed by disconnecting the color matching line herein.

The present invention provides various methods to achieve insulation by disconnection:

(1) One column of the color matching line between the branch portions 124 of two adjacent wiring clusters is removed. Referring to FIG. 4B, the color matching line loses a mesh side which is intersected with a first line 131. The first line 131 is a virtual straight line extending in a direction parallel to the extension direction of the trunk portion 124, i.e., Y axis. The disconnection is equivalent to lose a plurality of sides on the basis of the original mesh cell without changing the cycle of the mesh cell, thus no obvious color difference will appear when displaying.

Figure 5:
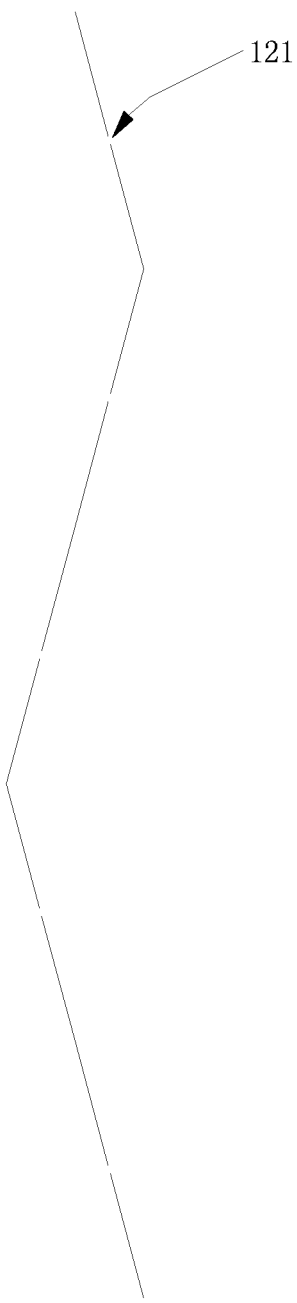
FIG. 5 is a schematic view of an embodiment of an insulation structure formed by disconnecting the color matching line.

(2) The color matching line between the branch portions of two adjacent wiring clusters is disconnected in a middle portion of the mesh side. Referring to FIG. 5, a notch 121 is formed at the disconnection, a length of the disconnection ranges from 2 to 20 micrometers, preferably from 3 to 9 micrometers. In a preferred embodiment, the length of the disconnection is 6 micrometers. If the interval between the trunk portions 124 of two adjacent clusters is wide enough, and there are multi-column color matching lines, theoretically it is not necessary to disconnect all mesh sides of the color matching line. For example, only one column of the color matching line can be disconnected, i.e., to disconnect the color matching line intersected by the first line 131. Taking into account the case that the location originally designed to be disconnected during the fabrication is probably connected due to defective fabrication, more color matching lines can be disconnected, for instance, each side of the color matching line between the trunk portions 124 of two adjacent wiring clusters is disconnected in a middle portion, so as to ensure the insulation effect.

Figure 6:
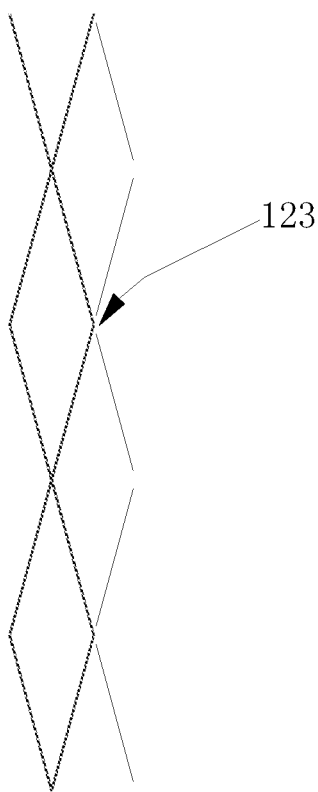
FIG. 6 is a schematic view of another embodiment of an insulation structure formed by disconnecting the color matching line.

(3) The trunk portion 124 is disconnected at an intersection point of the mesh cell adjacent to a color matching line. Referring to FIG. 6, the trunk portion 124 is disconnected at an intersection point 123 of the mesh cell. It is to be understood that, each trunk portion 124 only needs to be disconnected with the left adjacent color matching line or the right adjacent color line at an intersection point of the mesh cell to perform insulation. However, in order to ensure the insulation effect even in the case that the location originally designed to be disconnected during the fabrication is probably connected due to defective fabrication, both of the left and the right adjacent intersection points can be disconnected.

The embodiment shown in FIG. 4A is the combination of the above mentioned case (1) and case (2), i.e. the trunk portion 124 is disconnected at an intersection point 123 of the mesh cell adjacent to a color matching line, the side between the disconnected intersection points 123 is disconnected in a middle portion to form the notch 121.

The above mentioned notches of the case (2) and (3) and the notch of the embodiment of FIG. 4A can further reduce the color difference since the sizes of the notches are ignorable comparing to the side.

The above mentioned conductive layer having a structure of metal mesh can be manufactured by imprinting process. Comparing to the conventional technology which uses ITO as conductive layer, a shape of the on metal mesh can formed in one step in the imprinting process, which is simple and high in yield. In addition, the ITO is replaced by metal, which greatly reduces material cost. Since no etching process is used, the conductive material will not be wasted, and emission of the heavy metal in the waste liquid is thus reduced.

It should be understood that the descriptions of the examples are specific and detailed, but those descriptions can't be used to limit the present disclosure. Therefore, the scope of protection of the invention patent should be subject to the appended claims.

What is claimed is:

1. A conductive layer of a touch screen, comprising:
    a mesh composed of metal wire, the mesh comprising a plurality of mesh cells, the mesh cell comprising a plurality of sides and a plurality of intersection points formed where two adjacent sides connect; the conductive layer comprising a sensing area and a wiring area electrically connected to the sensing area;
    wherein the sensing area comprises a plurality of first sensing patterns and a plurality of second sensing patterns, the first sensing patterns and the second sensing patterns are adjacent and electrically insulated from each other, the mesh cells in each first sensing pattern are mutually connected, the mesh cells in each second sensing area are mutually connected;
    the wiring area comprises a plurality of wiring clusters, the wiring clusters are mutually insulated, each wiring cluster is formed by interconnecting a column of mesh cells, one end of each wiring cluster is electrically connected to one of the second sensing pattern, wherein part of each wiring cluster comprises a trunk portion, and two adjacent mesh cells in the trunk portion are merely connected by a common intersection point.

2. The conductive layer of the touch screen according to claim 1, wherein each wiring cluster has two common intersection points with the second sensing pattern.

3. The conductive layer of the touch screen according to claim 2, wherein two adjacent mesh cells in part of the wiring clusters are connected by a common side and have two common intersection points.

4. The conductive layer of the touch screen according to claim 1, wherein part of the wiring cluster further comprises a branch portion connected to the trunk portion, wherein two adjacent mesh cells in the branch portion are connected by a common side and have two common intersection points, and wherein a mesh cell at one end of the branch portion is connected to a mesh cell at one end of the trunk portion by a common side.

5. The conductive layer of the touch screen according to claim 1, wherein the conductive layer further comprises a color matching line forming a complementary pattern with the sensing area and the wiring area, and the color matching line is insulated from the sensing area and the wiring area.

6. The conductive layer of the touch screen according to claim 5, wherein the color matching line between the trunk portions of two adjacent wiring clusters loses a mesh side intersected with a first line, and wherein the first line is the straight line extending in a direction parallel to an extension direction of the trunk portion.

7. The conductive layer of the touch screen according to claim 5, wherein the color matching line between the trunk portions of two adjacent wiring clusters is disconnected in a middle portion of the mesh side.

8. The conductive layer of the touch screen according to claim 7, wherein a length of the disconnection ranges from 2 to 20 micrometers.

9. The conductive layer of the touch screen according to claim 8, wherein the length of the disconnection ranges from 3 to 9 micrometers.

10. The conductive layer of the touch screen according to claim 9, wherein the length of the disconnection is 6 micrometers.

11. The conductive layer of the touch screen according to claim 5, wherein the trunk portion is disconnected at an intersection point of the mesh cell adjacent to a color matching line.

12. The conductive layer of the touch screen according to claim 1, wherein the mesh cell of the mesh has a shape of rhombus.

13. The conductive layer of the touch screen according to claim 1, wherein the sensing area includes a left sensing area and a right sensing area, which are separately arranged, wherein each left sensing area and each right sensing area both include a plurality of first sensing patterns and a plurality of second sensing patterns, and wherein the wiring area is located between the left sensing area and the right sensing area.

14. The conductive layer of the touch screen according to claim 1, wherein the conductive layer is axisymmetric.

* * * * *